United States Patent [19]

McLellan et al.

[11] Patent Number: 5,682,068
[45] Date of Patent: Oct. 28, 1997

[54] POWER CAP

[75] Inventors: Neil McLellan, Garland; Mark A. Gerber, Plano; Michael K. Strittmatter, Carrollton; Joseph P. Hundt, Corinth, all of Tex.

[73] Assignee: Dallas Semiconductor Corp., Dallas, Tex.

[21] Appl. No.: 568,851

[22] Filed: Dec. 7, 1995

[51] Int. Cl.$^6$ ............................................. H01L 23/12
[52] U.S. Cl. .................... 307/150; 361/679; 365/226; 365/229; 257/678; 257/704
[58] Field of Search .................... 307/150; 305/226, 305/229; 257/924, 678, 704; 361/679; 368/281, 203

[56] References Cited

U.S. PATENT DOCUMENTS

| | | | |
|---|---|---|---|
| 4,701,858 | 10/1987 | Stokes et al. | 364/483 |
| 5,153,710 | 10/1992 | McCain | 357/75 |
| 5,276,354 | 1/1994 | Link et al. | 307/66 |
| 5,289,034 | 2/1994 | Hundt | 257/678 |
| 5,297,099 | 3/1994 | Bolan et al. | 365/229 |
| 5,528,460 | 6/1996 | Byrd | 361/752 |
| 5,570,273 | 10/1996 | Seigel et al. | 361/773 |

*Primary Examiner*—William M. Shoop, Jr.
*Assistant Examiner*—Albert W. Paladini
*Attorney, Agent, or Firm*—Jenkens & Gilchrist

[57] ABSTRACT

The power cap includes a power supply positioned between a cover and a base. The cover is provided with clips to permit the attachment and detachment of the cover to the power supply and the base. The base is provided with surface mounted NRTC or NVSRAM chips and electrical contacts. The power supply is provided with a crystal oscillator and a battery for controlling the operation of the NRTC or NVSRAM chips, and spring contacts for maintaining the electrical connection between the base and the power supply.

30 Claims, 3 Drawing Sheets

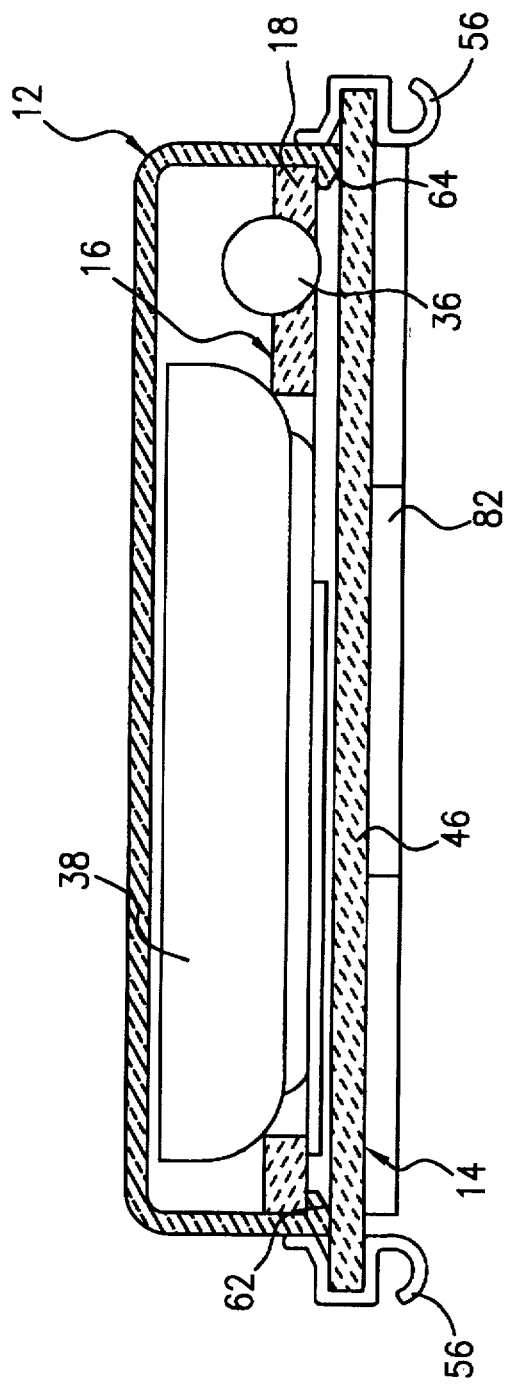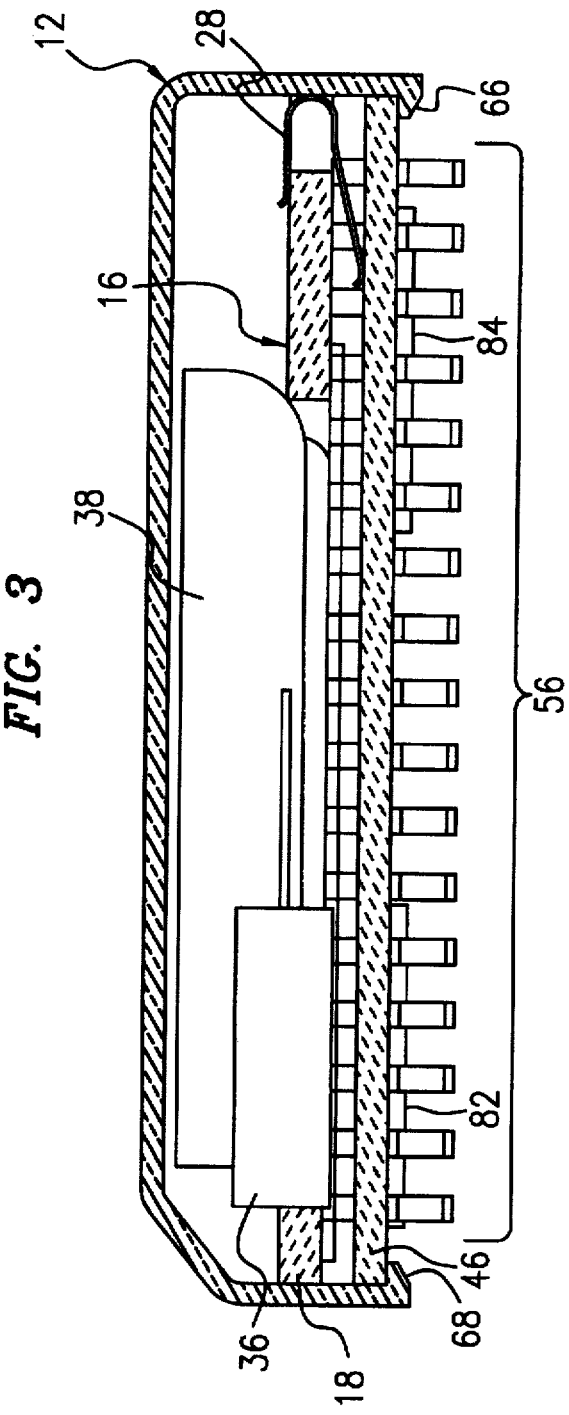

POWER CAP

TECHNICAL FIELD OF THE INVENTION

The present invention relates to structures than can be connected to chips to enhance the capabilities and functions thereof and, in particular, to a power cap for a nonvolatile real time clock or a nonvolatile static RAM.

BACKGROUND OF THE INVENTION

The market for surface mounted Nonvolatile Real Time Clock (NRTC) devices, Nonvolatile Static RAM (NVSRAM) devices, and other lithium battery backed integrated circuits has been limited due to the physical characteristics of the battery and the crystal oscillator as well as the physical characteristics of the devices themselves.

Many current NRTC and NVSRAM devices consist of a large encapsulated part utilizing a package that must be installed by hand or wave soldering, or through the use of a special socket. However, because batteries and crystal oscillators are temperature sensitive, these devices cannot be surface mounted using reflow surface mounting techniques. Reflow surface mounting requires that the device be subjected to high temperatures (approximately 215° C.) for proper attachment. These high temperatures damage the temperature sensitive batteries and crystals.

An additional problem with this technology occurs when the batteries of the devices are exhausted. When this occurs, the entire device must be removed and replaced with an new device. This creates higher costs to the user.

Because of these problems as well as the large size of the encapsulated parts, many electronic devices such as the laptop personal computer and other small scale computers have to be manufactured without these types of NRTC or NVSRAM packages.

Currently, the single chip surface mountable plastic leaded chip carrier (PLCC), small outline integrated circuit (SOIC), thin small outline package (TSOP), and small outline J-lead (SOJ) versions of the NRTC and NVSRAM are sold to electronic manufacturers without a battery or a crystal oscillator. It is the manufacturer who is required to mount a battery and a crystal oscillator on the printed circuit board after the device has been surface mounted.

A major problem with this configuration also occurs when a problem with the battery or the crystal oscillator arises or when the product has completed its useful life. When these situations occur the old battery and crystal oscillator have to be un-soldered prior to the installation of a replacement battery and crystal. This process is very timely and ultimately leads to higher manufacturing cost.

One device manufacture, SGS Thompson, has made a device having a battery and crystal module attachable to a modified NRTC device. The battery and crystal module has contact pins which extend from the module and are inserted into matching female receptacles in the NRTC device. The battery and crystal module is designed to be attached to the NRTC device after the NRTC device has been surface mounted.

While the SGS Thompson's device does have some advantages over the current DIP lead technology, the height of the device is still too large for many applications. In addition, because this device is a single chip device, the market demand for high density memory devices which combine a controller chip and a separator memory chip, can not be met.

Because of the female receptacles in the NRTC device, the NRTC device must be modified or custom made to accommodate the contact pins of the module. Therefore, these devices are not compatible with market standard NRTCs having TSOP, PLCC, SOIC, or SOJ chips.

An additional problem with the SGS device is that the cleaning materials used to clean surface mounted devices tend to get trapped in the female receptacles. Also, prior to the attachment of the battery and crystal module, the exposed contact pins of the module are highly susceptible to shorting during handling.

Currently, there also is a Low Profile Module (LPM) for NVSRAMs, which, like the SGS device, has some advantages over the DIP lead technology. However, the LPM requires the user to provide an additional socket which must be surface mounted prior to the installation of the LPM. Further, the socket and LPM device have a larger area and larger height associated with it due to the addition of the socket.

SUMMARY OF THE INVENTION

The present invention overcomes the shortcomings and deficiencies of the existing technologies by providing a power cap having a battery and a crystal oscillator that can be attached to existing NRTC and NVSRAM devices utilizing standard TSOP, SOIC, PLCC and SOJ type chips.

Accordingly, it is an object of the present invention to provide a power cap that can be readily attached and removed from existing NRTC and NVSRAM devices having standard TSOP, SOIC, PLCC, and SOJ type chips.

It is a further object of the present invention to provide a power cap such that when attached to an NRTC or NVSRAM device, the resulting size of the device is smaller in area and height than existing devices.

It is yet another object of the present invention to provide a power cap having mechanical clips so that the power cap can be easily snapped onto a surface mounted NRTC or NVSRAM device.

It is another object of the present invention to provide a power cap which is compatible with single and multi chip NRTC and NVSRAM devices.

It is still another object of the present invention to provide a power cap which is not prone to shorting prior to assembly with an NRTC or NVSRAM device.

It is a further object of the present invention to provide a power cap which is compatible with surface mount cleaning technologies.

BRIEF DESCRIPTION OF THE DRAWINGS

A more complete understanding of the present invention may be had by reference to the following Detailed Description when taken in conjunction with the accompanying Drawings wherein:

FIG. 3 is a sectional view taken along line 3—3 of FIG. 1; and

FIG. 4 is a sectional view taken along line 4—4 of FIG. 1.

DETAILED DESCRIPTION OF THE PRESENTLY PREFERRED EXEMPLARY EMBODIMENTS

Figure 1:
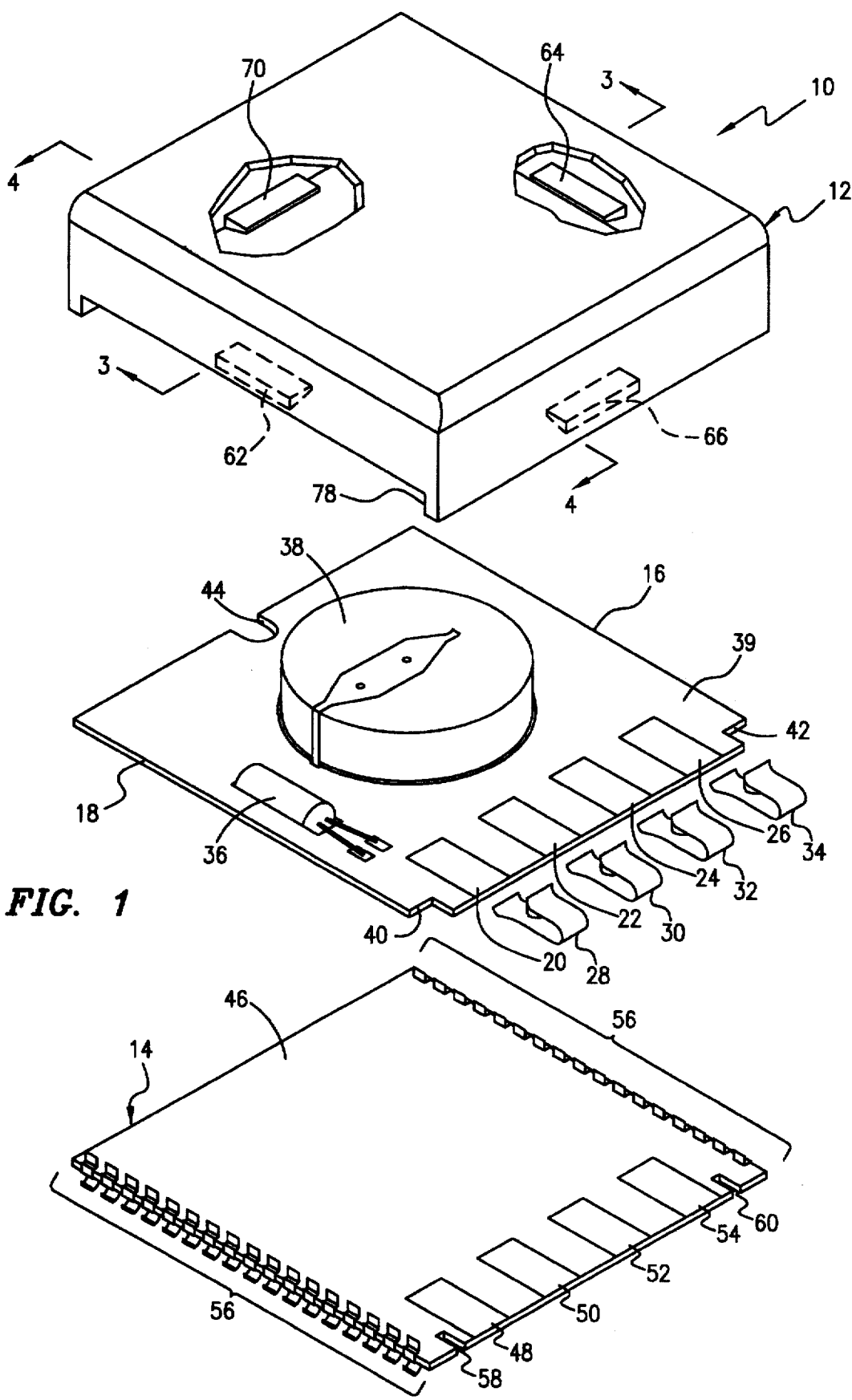
FIG. 1 is an exploded perspective view illustrating the main components of a preferred embodiment of the present invention with the cover having portions broken away.

Referring now to the drawings wherein like or similar elements are designated with identical reference numerals throughout the several views, and wherein the various elements depicted are not necessarily drawn to scale, and in particular, to FIG. 1, there is shown a preferred embodiment of the present invention in the form of a power cap 10.

Power cap 10 includes three major components; a cover 12, a base 14, and an intermediate or power section 16.

Power section 16 includes a printed circuit board 18, electrical contacts 20, 22, 24, and 26, spring connectors 28, 30, 32, and 34, a crystal oscillator 36, and a battery 38.

Electrical contacts 20, 22, 24 and 26 are located along edge 39 of printed circuit board 18. Spring connectors 28, 30, 32, and 34 are connected to electrical contacts 20, 22, 24 and 26 respectively, and extend below printed circuit board 18. Good results have been achieved using gold plated electrical contacts for contacts 20, 22, 24 and 26.

Printed circuit board 18 is configured with three notches, 40, 42 and 44, which are used to properly align power section 16 within cover 12 during assembly.

As previously mentioned, crystal oscillator 36 and battery 38 are mounted to printed circuit board 18. Crystal oscillator 36 is electrically connected to contacts 20 and 26, and battery 38 is electrically connected to contacts 22 and 24. Battery 38 supplies power to base 14, with base 14 in turn supplying power to crystal 36.

Base 14 includes printed circuit board electrical contacts 48, 50, 52 and 54, and multiple connector leads 56.

Electrical contacts 48, 50, 52 and 54 are located on printed circuit board 46 in alignment with electrical contacts 20, 22, 24 and 26 of power section 16. When power cap 10 is assembled, spring connectors 28, 30, 32 and 34 come into surface contact with electrical contacts 48, 50, 52 and 54 respectively, and provide the electrical connection between base 14 and power section 16. Good results have been achieved using gold plated electrical contacts for contacts 48, 50, 52 and 54.

Printed circuit board 46 is also configured with two notches 58 and 60 to assure proper alignment of base 14 within cover 12.

Connector leads 56 permit the mounting of power cap 10 to an electronic device such as a mother board within a laptop computer.

Figure 2:
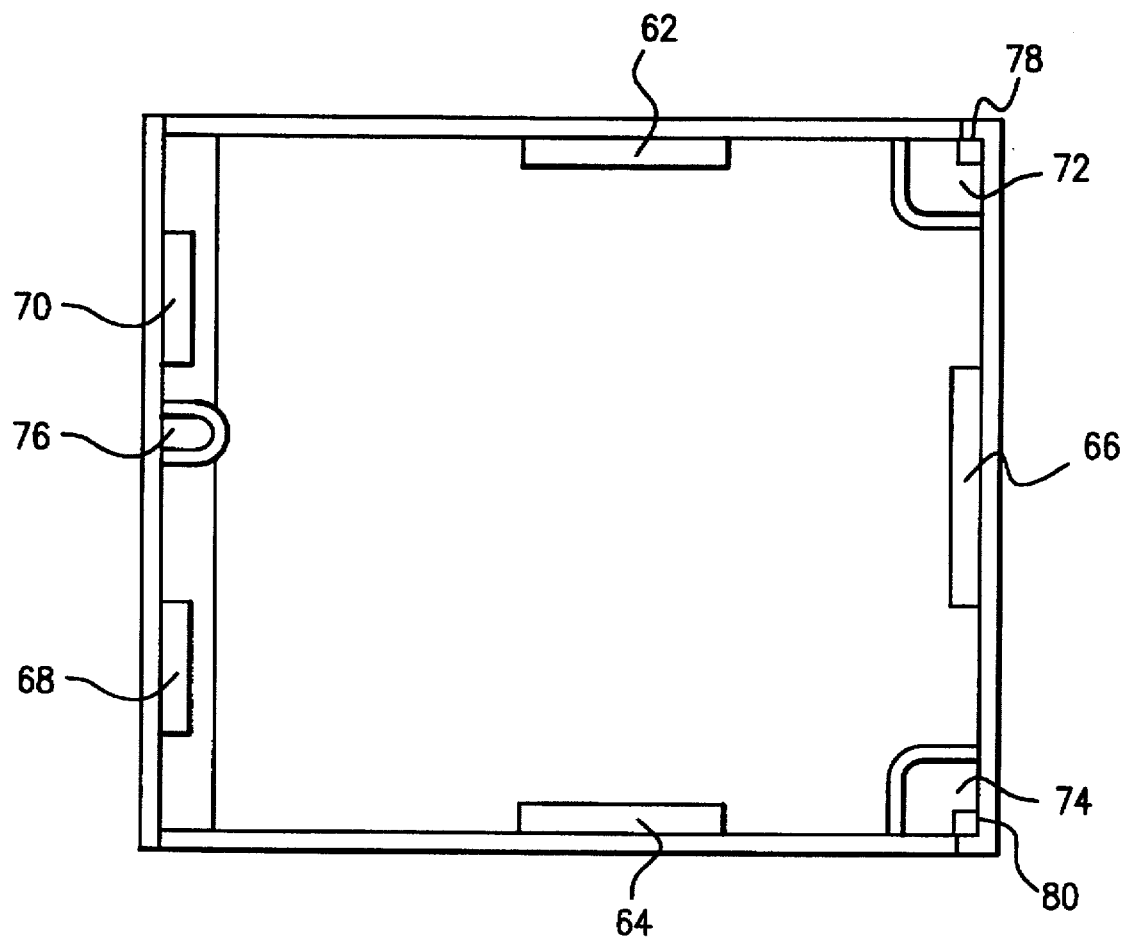
FIG. 2 is a bottom plan view of the cover of an embodiment of the present invention.

Referring to FIGS. 1 and 2, FIG. 1 shows a perspective view of cover 12 with portions broken and FIG. 2 shows a bottom view of cover 12. Cover 12 includes mechanical clips 62, 64, 66, 68 and 70, alignment nodules or posts 72, 74 and 76 and alignment edges 78 and 80.

Clips 62 and 64 attach power section 16 to cover 12, and clips 66, 68 and 70 attach base 14 to cover 12 and power section 16. Although good results have been achieved using clips 62, 64, 66, 68 and 70 to assemble power cap 10, it is contemplated to be within the scope of this invention that other types of attachment devices can also be used.

Power cap 10 is assembled by either inserting notch 44 of power section 16 over alignment post 76 or by inserting notches 40 and 42 over alignment posts 72 and 74. Power section 16 is then snapped into cover 12 such that snaps 62 and 64 snap around the edges of power section 16 (See FIG. 3).

Alignment post 76 is positioned slightly off center in cover 12 so that power section 16 can only be inserted with electrical contacts 20, 22, 24 and 26 facing cover 12. This prevents the improper insertion of power section 16 into cover 12.

Notches 58 and 60 of base 14 are then inserted over alignment edges 78 and 80 respectively, such that electrical contacts 48, 50, 52 and 54 are facing spring contacts 28, 30, 32 and 34. Base 14 is then snapped into cover 12 such that snaps 66, 68, and 70 snap around the edges of base 14 (See FIG. 4) bringing spring contacts 28, 30, 32 and 34 into contact with electrical contacts 48, 50, 52 and 54.

When base 14 and power section 16 have been properly assembled within cover 12, spring contacts 28, 30, 32 and 34 maintain the electrical connection between power section 16 and base 14 (See FIG. 4).

In use, nonvolatile real time clock chips 82, and 84 are surface mounted to printed circuit board 46 of base 14, on the surface of printed circuit board 46 opposite contacts 48, 50, 52 and 54 (See FIG. 4). Good results have been achieved in utilizing market standard TSOP, PLCC, SOIC and SOJ chips in this type of configuration.

It is contemplated to be within the scope of the invention to vary the positions of battery 38 and crystal oscillator 36 on printed circuit board 18 to accommodate nonvolatile real time clock chips of varying sizes and to accommodate these chips mounted in various positions.

Although a preferred embodiment of the method and apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A power cap, comprising:
   a. a base including electronic circuitry;
   b. means positioned proximate said base, for providing power to said electronic circuitry;
   c. means for providing electrical connection between said base and said power means; and
   d. means for attaching said base with said power means, said attaching means including a cover for housing said power means therein.

2. A power cap as recited in claim 1, wherein:
   a. said cover is detachable.

3. A power cap as recited in claim 1, wherein:
   a. said power means is positioned intermediate said cover and said base.

4. A power cap as recited in claim 1, wherein:
   a. said power means includes a battery electrically connected to a printed circuit board.

5. A power cap as recited in claim 4, wherein:
   a. said power means includes a crystal oscillator electrically connected to said printed circuit board.

6. A power cap as recited in claim 4, wherein:
   a. said electrical connection means includes at least one electrical contact on said printed circuit board; and
   b. said at least one electrical contact electrically connected to said power means.

7. A power cap as recited in claim 6, wherein:
   a. said electrical connection means includes at least one spring connector with a first and a second end; and
   b. said first end is connected to said at least one electrical contact.

8. A power cap as recited in 1, wherein:
   a. said attaching means includes at least one clip attached to said cover for interlocking with an edge of said power means.

9. A power cap as recited in 1, wherein:
a. said attaching means includes at least one clip attached to said cover for interlocking with an edge of said base.

10. A power cap as recited in 1, further comprising:
a. means for aligning said power means and said base with said cover.

11. A power cap as recited in claim 10, wherein:
a. said aligning means includes at least one post attached to said cover.

12. A power cap as recited in claim 11, wherein:
a. said aligning means includes at least one notch in said base, said at least one post for insertion into said at least one notch in said base.

13. A power cap as recited in claim 11, wherein:
a. said aligning means includes at least one notch in said power means, said at least one post for insertion into said at least one notch in power means.

14. A power cap as recited in claim 1, wherein:
a. said electronic circuitry includes a clock chip surface mounted to said base.

15. A power cap as recited in claim 7, wherein:
a. said electronic circuity includes at least one electrical contact; and
b. said second end of said spring connector in electrical contact with said at least one electrical contact of said electrical circuitry.

16. A power cap as recited in 1, wherein:
a. said base includes a plurality of electrical leads.

17. A power cap for a nonvolatile real time clock circuit, comprising:
a. a removable power supply for supplying power to a nonvolatile real time clock circuit;
b. a removable cover for housing at least a portion of said power supply and said circuit therein;
c. said power supply positioned proximate said cover and said circuit;
d. an electrical connection electrically connecting said power and said circuit; and
e. said cover including a first connector for attaching said cover to said circuit.

18. A power cap as recited in claim 17, wherein:
a. said power supply includes a battery and a crystal oscillator.

19. A power cap as recited in claim 18, wherein:
a. said electrical connection includes at least four electrical pads on said power supply;
b. each of said battery and said oscillator being electrically connected to two of said electrical pads;
c. said electrical connection includes at least four spring connectors, each having first and second ends; and
d. each of said first ends connected to one of said electrical pads.

20. A power cap as recited in claim 19, wherein:
a. said electrical connection includes at least four electrical pads on said circuit; and b. each of said second ends of said spring connectors in electrical contact with one of said electrical pads on said circuit.

21. A power cap as recited in claim 20, wherein:
a. said power supply positioned intermediate said cover and said circuit; and
b. said cover includes a second connector for attaching said cover to said power supply.

22. A power cap as recited in claim 19, further comprising:
a. an alignment device for aligning said power supply and said circuit with said cover.

23. A power cap as recited in claim 22, wherein:
a. said cover includes a side wall;
b. said alignment device includes a nodule attached to said side wall of said cover; and
c. said side wall extending below each of said spring connectors.

24. A power cap as recited in claim 23, wherein:
a. said alignment device includes a notch in said power supply for receiving said nodule.

25. A power cap as recited in claim 24, wherein:
a. said alignment device includes a notch in said circuit for receiving said nodule.

26. A power cap for a nonvolatile real time clock circuit, comprising:
a. a removable power supply for supplying power to a nonvolatile real time clock circuit;
b. said power supply including a battery and a crystal oscillator;
c. a removable cover for housing at least a portion of said power supply and said circuit therein;
d. said power supply positioned intermediate said cover and said circuit;
e. an electrical connection connecting said power and said circuit; and
f. said cover including a first and a second connector, said first connector attaching said cover to said circuit and said second connector attaching said cover to said power supply.

27. A power cap as recited in claim 26, wherein:
a. an alignment device for aligning said power supply and said circuit with said cover.

28. A power cap as recited in claim 27, wherein:
a. said cover includes a side wall;
b. said alignment device includes a nodule attached to said side wall of said cover.

29. A power cap as recited in claim 28, wherein:
a. said alignment device includes a notch in said power supply for receiving said nodule.

30. A power cap as recited in claim 29, wherein:
a. said alignment device includes a notch in said circuit for receiving said nodule.

* * * * *

UNITED STATES PATENT AND TRADEMARK OFFICE
CERTIFICATE OF CORRECTION

PATENT NO. :     5,682,068
DATED      :     Oct. 28, 1997
INVENTOR(S):     McLellan et al.

It is certified that error appears in the above-identified patent and that said Letters Patent is hereby corrected as shown below:

Column 4, line 64      After "in"
                       Insert --claim--

Column 5, line 1       After "in"
                       Insert --claim--

Column 5, line 4       After "in"
                       Insert --claim--

Column 5, line 29      After "in"
                       Insert --claim--

Signed and Sealed this

Twenty-fifth Day of August, 1998

Attest:

Attesting Officer

BRUCE LEHMAN

Commissioner of Patents and Trademarks